US012620985B2

(12) United States Patent
Yang et al.

(10) Patent No.:   US 12,620,985 B2
(45) Date of Patent:          May 5, 2026

(54) LOW POWER CONSUMPTION POWER-ON RESET SYSTEM

(71) Applicant: Richtek Technology Corporation, Hsinchu (TW)

(72) Inventors: Tsung-Han Yang, Taipei (TW); Pao-Hsun Yu, Hsinchu (TW); Yung-Ming Chang, Changhua (TW)

(73) Assignee: Richtek Technology Corporation, Hsinchu (TW)

( * ) Notice: Subject to any disclaimer, the term of this patent is extended or adjusted under 35 U.S.C. 154(b) by 18 days.

(21) Appl. No.: 18/671,940

(22) Filed: May 22, 2024

(65) Prior Publication Data

US 2025/0266824 A1      Aug. 21, 2025

(30) Foreign Application Priority Data

Feb. 20, 2024    (TW) ................................. 113106036

(51) Int. Cl.
  *H03K 17/22*          (2006.01)
  *H03K 19/20*          (2006.01)
(52) U.S. Cl.
  CPC ........... *H03K 17/223* (2013.01); *H03K 19/20* (2013.01); *H03K 2217/0036* (2013.01)
(58) Field of Classification Search
  CPC ................. H03K 17/223; H03K 19/20; H03K 2217/0036
  USPC .......................................................... 327/143
  See application file for complete search history.

(56) References Cited

U.S. PATENT DOCUMENTS

| | | | | |
|---|---|---|---|---|
| 5,323,066 A | * | 6/1994 | Feddeler .............. | H03K 17/223 |
| | | | | 327/535 |
| 6,181,628 B1 | * | 1/2001 | Reynolds ............... | G11C 5/143 |
| | | | | 365/194 |
| 6,363,025 B1 | * | 3/2002 | McLaury ................. | G11C 8/18 |
| | | | | 327/143 |
| 7,701,265 B2 | * | 4/2010 | Maeda ................... | H03K 17/22 |
| | | | | 327/143 |
| 2013/0021071 A1 | * | 1/2013 | Nadimpalli .......... | H03K 17/223 |
| | | | | 327/143 |
| 2015/0109841 A1 | * | 4/2015 | Lim ......................... | G11C 8/06 |
| | | | | 365/49.1 |
| 2023/0014679 A1 | * | 1/2023 | Ji ......................... | G11C 11/4074 |

* cited by examiner

*Primary Examiner* — Ryan Jager
(74) *Attorney, Agent, or Firm* — Huan-Yi Lin

(57)          ABSTRACT

A Power-on Reset (POR) system includes: an SR latch circuit, powered by a supply voltage, for generating a POR signal according to the supply voltage and an enable signal; and at least one operating circuit, powered by the supply voltage. At least one state circuit in the operating circuit is reset by the POR signal. When the supply voltage starts up, an output terminal of the SR latch circuit has a predetermined state, such that after the supply voltage starts up and before the enable signal is enabled for a first time, the POR signal is in a reset state to reset the at least one state circuit in the operating circuit. After the supply voltage starts up and the enable signal is enabled for the first time, the POR signal turns to a non-reset state, and the operating circuit is enabled to operate according to the enable signal.

8 Claims, 11 Drawing Sheets

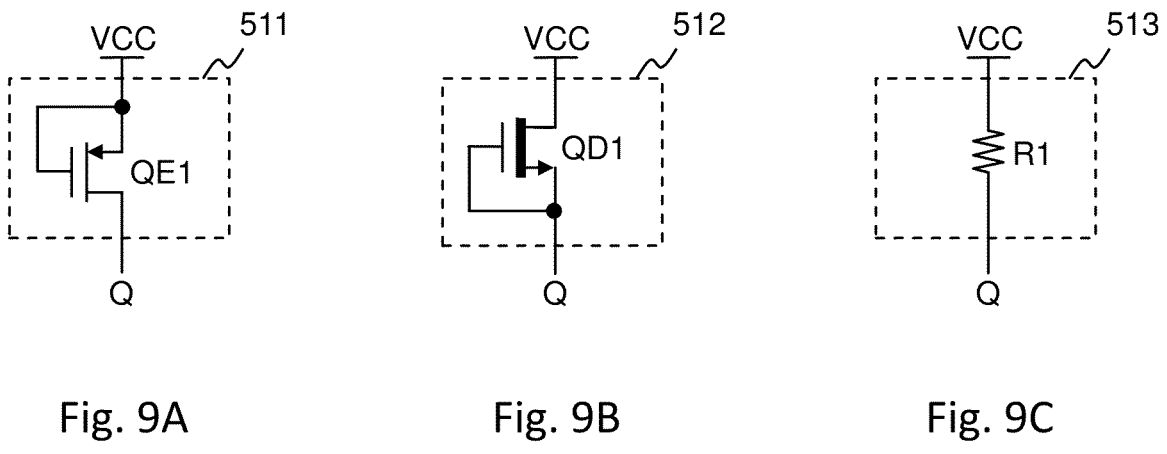
Fig. 9A                    Fig. 9B                    Fig. 9C
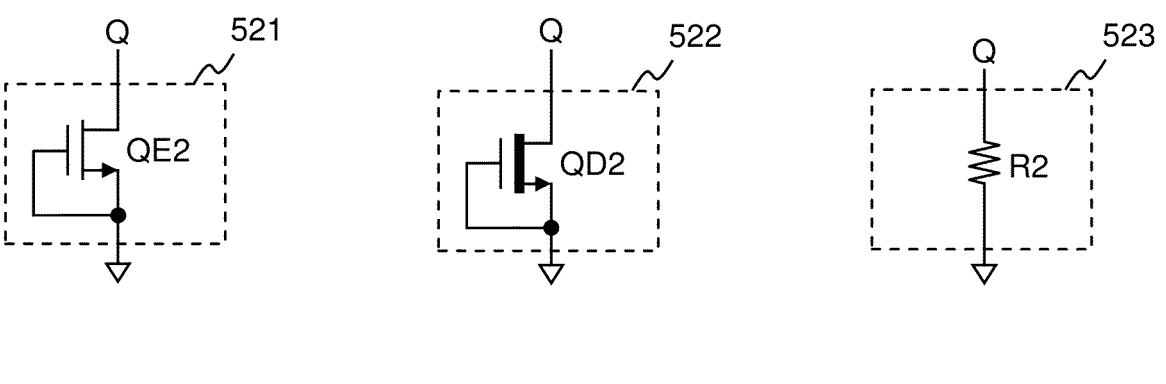
Fig. 10A                   Fig. 10B                   Fig. 10C

LOW POWER CONSUMPTION POWER-ON RESET SYSTEM

CROSS REFERENCE

The present invention claims priority to TW patent application Ser. No. 113106036, filed on Feb. 20, 2024.

BACKGROUND OF THE INVENTION

Field of Invention

The present invention relates to a power-on reset system. Particularly it relates to a low power consumption power-on reset system.

Description of Related Art

FIG. 1A shows a block diagram of a power-on reset system of prior art. As shown in FIG. 1A, in the power-on reset system 9000 of prior art, both the power-on reset circuit 910 and the operating circuit 920 are powered by the supply voltage VCC. The power-on reset circuit 910 generates a power-on reset signal POR' based on the supply voltage VCC. The operating circuit 920 resets plural SR latch circuits within the operating circuit 920 according to the power-on reset signal POR'.

FIGS. 1B and 1C show schematic diagrams of the power-on reset circuit of prior art. The power-on reset circuit 910 of FIG. 1A can be configured as the power-on reset circuit 911 of FIG. 1B or the power-on reset circuit 912 of FIG. 1C. As shown in FIG. 1B, the power-on reset circuit 911 includes a resistor Rs, a capacitor C and an inverter 9111. The inverter 9111 generates the power-on reset signal POR' based on the signal Sig at the joint node between the resistor Rs and the capacitor C. As shown in FIG. 1C, the power-on reset circuit 912 includes a reference signal generation circuit 9121 and a comparator 9122. The comparator 9122 generates the power-on reset signal POR' based on the reference signal Vref generated by the reference signal generation circuit 9121 and the supply voltage VCC.

FIG. 2 shows an operation waveform diagram corresponding to the power-on reset system of prior art in FIGS. 1A and 1B. One drawback of the prior art is that when the power-on reset circuit 910 of FIG. 1A is configured as the power-on reset circuit 911 of FIG. 1B, if the level of the supply voltage VCC ramps up slowly, the level of the power-on reset signal POR' will be too low to enter the reset state (e.g., high state), causing the plural SR latch circuits within the operating circuit 920 to also fail to enter the reset state. Another drawback of the prior art is that when the power-on reset circuit 910 of FIG. 1A is configured as the power-on reset circuit 912 of FIG. 1C, the power-on reset system is inefficient due to excessive power consumption.

In view of this, the present invention addresses the deficiencies of the prior art by proposing a low power consumption power-on reset system. The power-on reset system of the present invention, through the special design of the power-on reset circuit, not only reduces power consumption but also ensures that the level of the power-on reset signal can continue to keep ramping up, even when the level of the supply voltage ramps up slowly, to enter the reset state, thereby achieving the reset operation of the power-on reset circuit on the operating circuit.

SUMMARY OF THE INVENTION

From one perspective, the present invention provides a power-on reset system comprising: an SR latch circuit, powered by a supply voltage and configured to generate a power-on reset signal according to the supply voltage and an enable signal; and at least one operating circuit, powered by the supply voltage and configured to reset at least one state circuit within each of the at least one operating circuit according to the power-on reset signal; wherein when the supply voltage starts up, an output terminal of the SR latch circuit is configured to have and keep at a predetermined state, such that after a start-up of the supply voltage and before a first enablement of the enable signal, the power-on reset signal is in a reset state to reset the at least one state circuit within each of the at least one operating circuit; wherein after the first enablement of the enable signal subsequent to the start-up of the supply voltage, the power-on reset signal turns to a non-reset state.

In one preferred embodiment, the SR latch circuit includes plural logic gates which include: a first logic gate and a second logic gate cross-coupled through feedback connections to each other, wherein the first logic gate receives a signal related to the enable signal, and the second logic gate receives a signal related to the supply voltage, wherein one of outputs of either the first logic gate or the second logic gate corresponds to the power-on reset signal.

In one preferred embodiment, each of the plural logic gates includes plural upper transistors and plural lower transistors complementarily coupled to each other, wherein the conduction impedances of the plural upper transistors and the plural lower transistors in at least one of the first logic gate and the second logic gate are asymmetrical to an extent that the output terminal of the SR latch circuit has the predetermined state upon the start-up of the supply voltage.

In one preferred embodiment, the output terminal includes a positive output terminal and a negative output terminal, the power-on reset system further comprising: a pulling circuit configured to pull at least one of the positive output terminal and the negative output terminal to a corresponding predetermined voltage upon the start-up of the supply voltage, such that the output terminal of the SR latch circuit has the predetermined state.

In one preferred embodiment, the pulling circuit is configured to pull the positive output terminal to a first predetermined voltage, and/or to pull the negative output terminal to a second predetermined voltage, wherein the first predetermined voltage and the second predetermined voltage are complementary.

In one preferred embodiment, the pulling circuit includes a pulling component coupled to either the positive output terminal or the negative output terminal for pulling the respective terminal to the corresponding predetermined voltage, wherein the pulling component includes: an enhancement-mode MOS transistor controlled to be non-conductive; a depletion-mode MOS transistor controlled to be non-conductive; or a resistor.

In one preferred embodiment, each of the first logic gate and the second logic gate is either a NOR gate or a NAND gate.

In one preferred embodiment, after the first enablement of the enable signal following the start-up of the supply voltage and after the power-on reset signal turns to the non-reset state, the operating circuit is configured to operate when the enable signal is enabled and to cease operation when the enable signal is disabled.

The present invention addresses the deficiencies of the prior art by proposing a low power consumption power-on reset system. The power-on reset system of the present invention, through the special design of the power-on reset circuit, not only reduces power consumption but also ensures that the level of the power-on reset signal can continue to keep ramping up, even when the level of the supply voltage ramps up slowly, to enter the reset state, thereby achieving the reset operation of the power-on reset circuit on the operating circuit.

The objectives, technical details, features, and effects of the present invention will be better understood with regard to the detailed description of the embodiments below.

BRIEF DESCRIPTION OF THE DRAWINGS

FIGS. 9A to 9C show schematic diagrams of various specific embodiments of the pulling circuit corresponding to FIG. 8A of the present invention.

FIGS. 10A to 10C show schematic diagrams of various specific embodiments of the pulling circuit corresponding to FIG. 8B of the present invention.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1A:
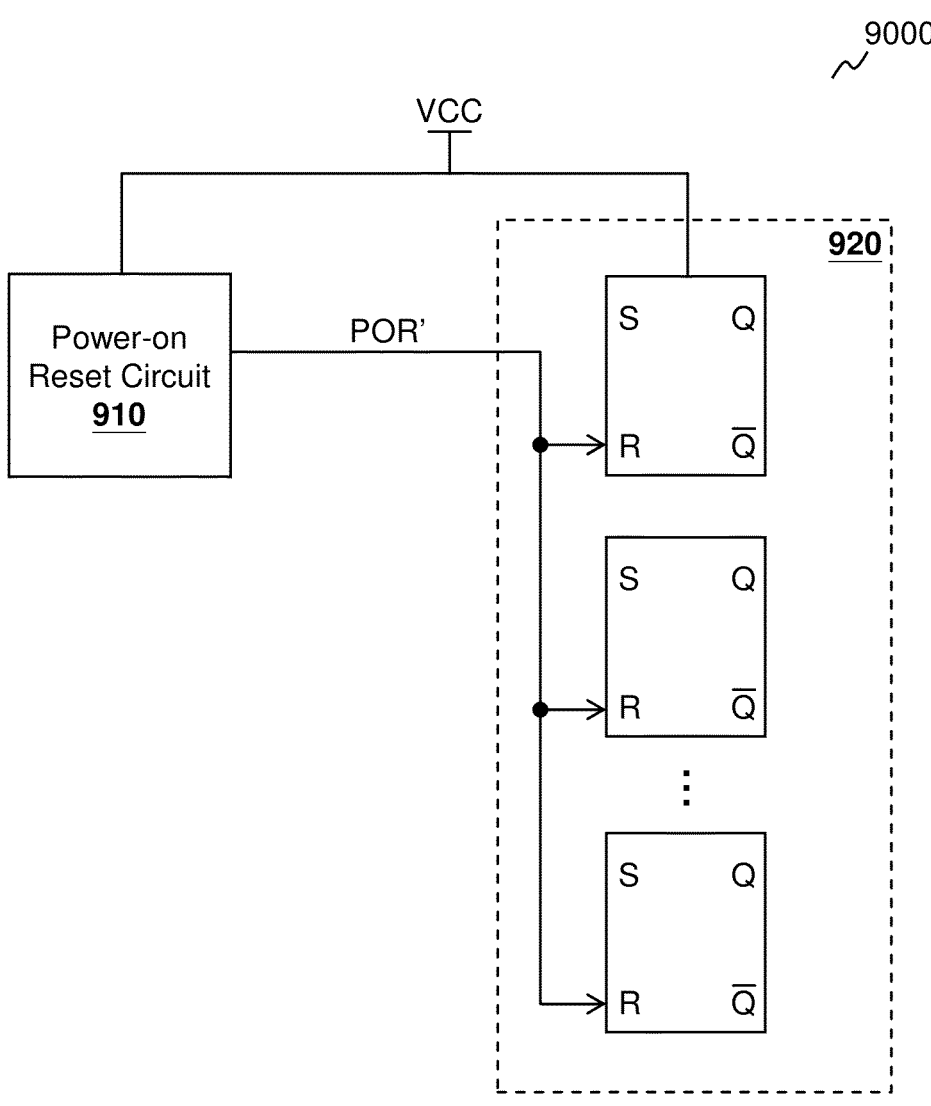
FIG. 1A shows a block diagram of a power-on reset system of prior art.
Figure 1B:
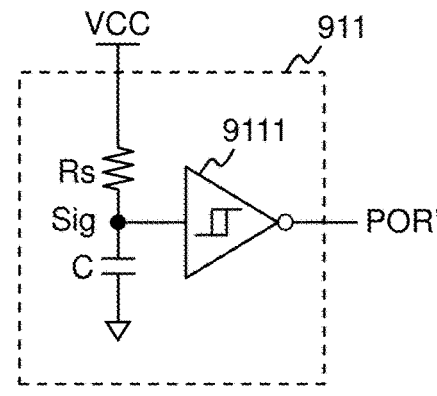
FIGS. 1B and 1C show schematic diagrams of the power-on reset circuit of prior art.
Figure 1C:
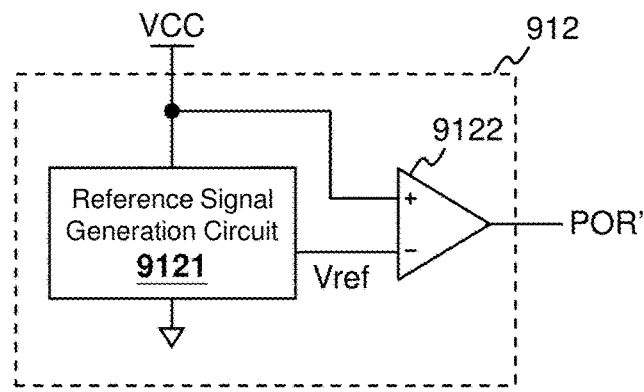
Figure 2:
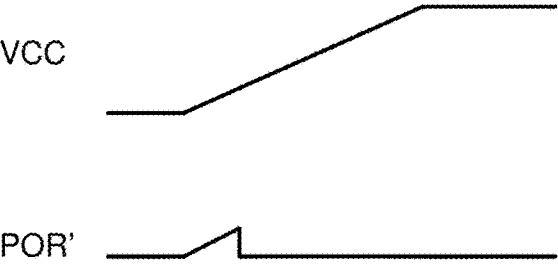
FIG. 2 shows an operation waveform diagram corresponding to the power-on reset system of prior art in FIGS. 1A and 1B.
Figures 3A, 3B:
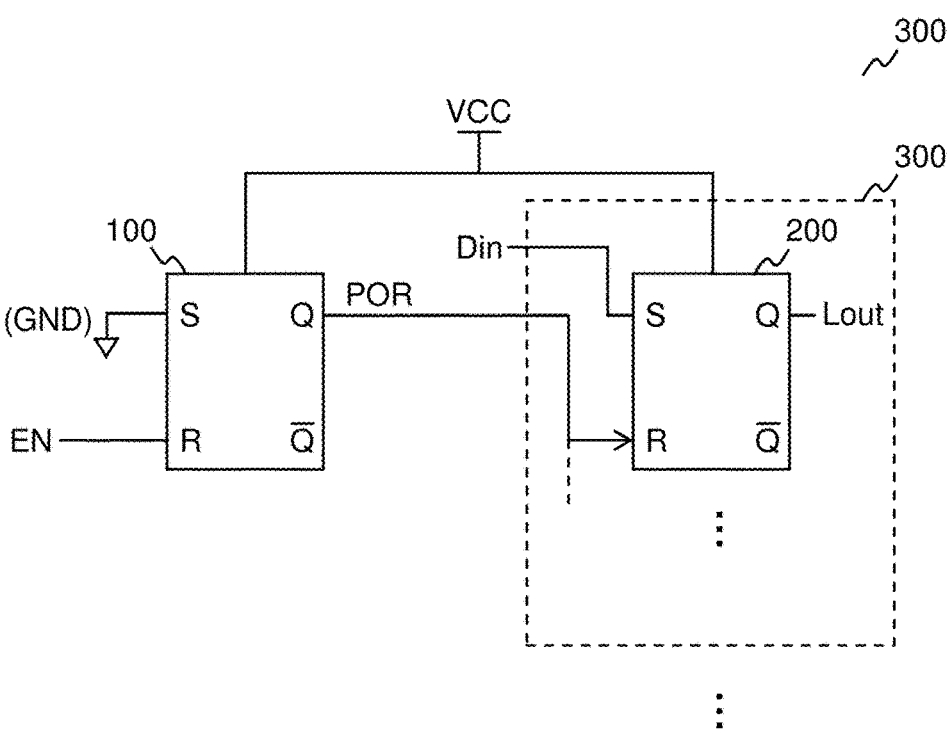
FIG. 3A shows a block diagram of an embodiment of the power-on reset system of the present invention.
FIG. 3B shows a block diagram of an embodiment of the power-on reset system of the present invention.

FIG. 3A shows a block diagram of an embodiment of the power-on reset system of the present invention. In one embodiment, a power-on reset system 3001 comprises an SR latch circuit 100 and at least one operating circuit. In this embodiment, the at least one operating circuit includes an operating circuit 300. In other embodiments, the at least one operating circuit may also include plural operating circuits, as those skilled in the art can infer from the description of the following embodiments. In one embodiment, the power-on reset circuit in the power-on reset system 3001 is configured as the SR latch circuit 100 to generate a power-on reset signal POR at the positive output terminal Q, thereby indicating to the operating circuit 300 to reset when required. In one embodiment, both the SR latch circuit 100 and the operating circuit 300 are powered by a supply voltage VCC. It should be noted that the SR latch circuit 100 includes a positive output terminal Q and a negative output terminal $\overline{Q}$ $\overline{Q}$ $\overline{Q}$ (the same applies to all SR latch circuits hereinafter), and either the positive output terminal Q or the negative output terminal $\overline{Q}$ $\overline{Q}$ $\overline{Q}$ can be used to generate the power-on reset signal POR according to the requirements (e.g., signal polarities) of the operating circuit.

As shown in FIG. 3A, in one embodiment, the SR latch circuit 100 generates the power-on reset signal POR based on the supply voltage VCC and the enable signal EN. The operating circuit 300 resets at least one state circuit within the operating circuit 300 according to the power-on reset signal POR, during start-up of the supply voltage. In this embodiment, the at least one state circuit includes a state circuit 200. In other embodiments, the at least one state circuit may also include plural state circuits, as those skilled in the art can infer from the description of the following embodiments. In this embodiment, the state circuit 200 is an SR latch circuit, and the power-on reset signal POR is coupled to a reset terminal R of the state circuit 200, thereby resetting the state circuit 200.

Figure 4A:
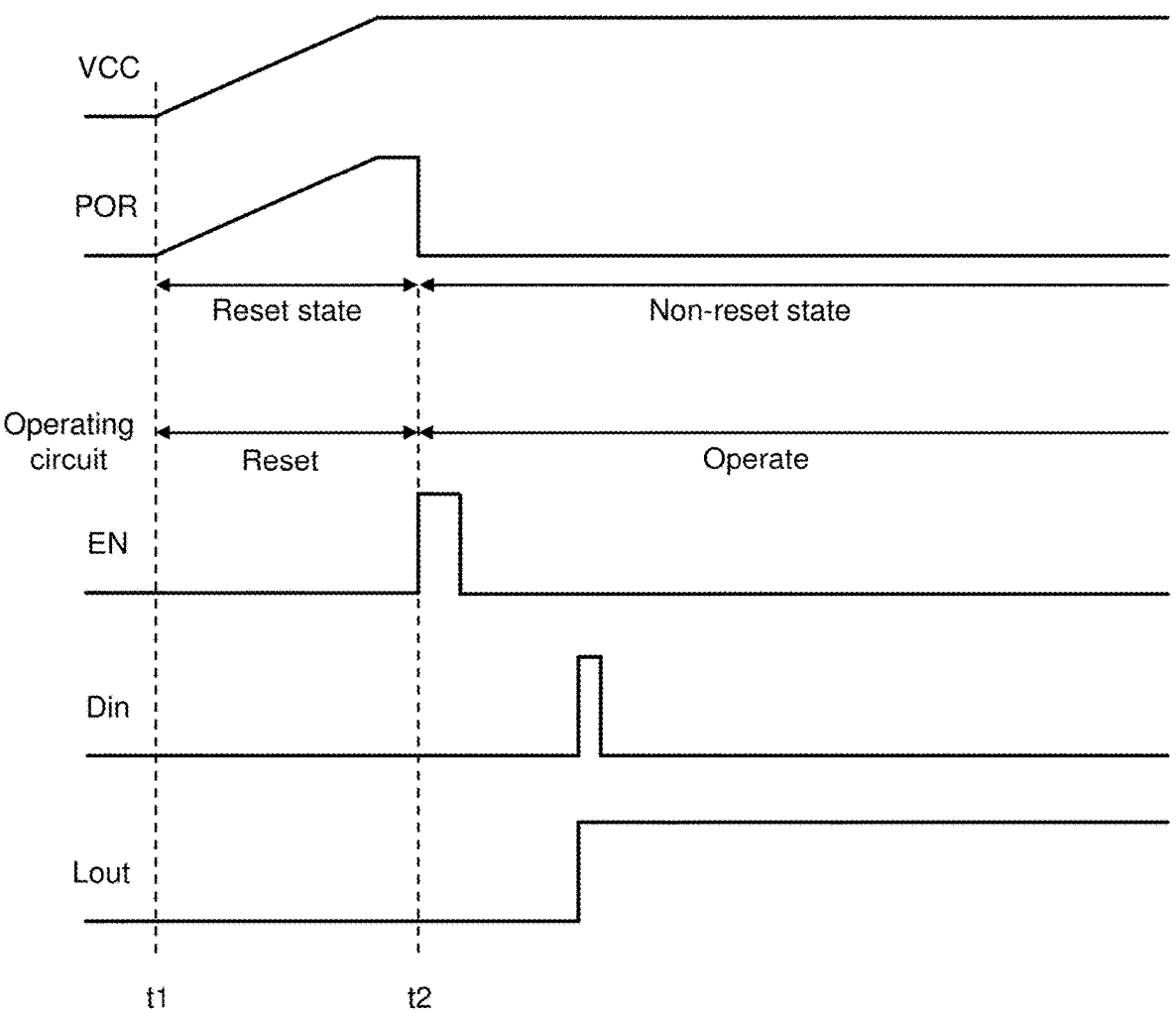
FIG. 4A shows an operation waveform diagram of an embodiment of the power-on reset system of the present invention.

Please refer to FIGS. 3A and 4A concurrently. FIG. 4A shows an operation waveform diagram of an embodiment of the power-on reset system of the present invention. In one embodiment, when the supply voltage VCC starts up (at time t1, where VCC starts to ramp up from 0V), the output terminal of the SR latch circuit 100 is configured to have and keep at a predetermined state. Thus, after the start-up of the supply voltage VCC and before a first enablement of the enable signal EN (from time t1 to t2 in FIG. 4A), the power-on reset signal POR is in a reset state (e.g., high level following the level of VCC) to reset the state circuit 200 within the operating circuit 300. In one embodiment, after the first enablement of the enable signal EN following the start-up of the supply voltage VCC (after time t2 in FIG. 4A), the power-on reset signal POR turns to a non-reset state (e.g., low level).

In the embodiments of FIGS. 3A and 4A, after the rising edge of the enable signal EN triggers the power-on reset signal POR to turn to a non-reset state, the operating circuit 300 can operate in an operating state. For example, in the non-reset state, the state circuit 200 within the operating circuit 300 generates an output signal Lout according to the input signal Din.

Figure 4B:
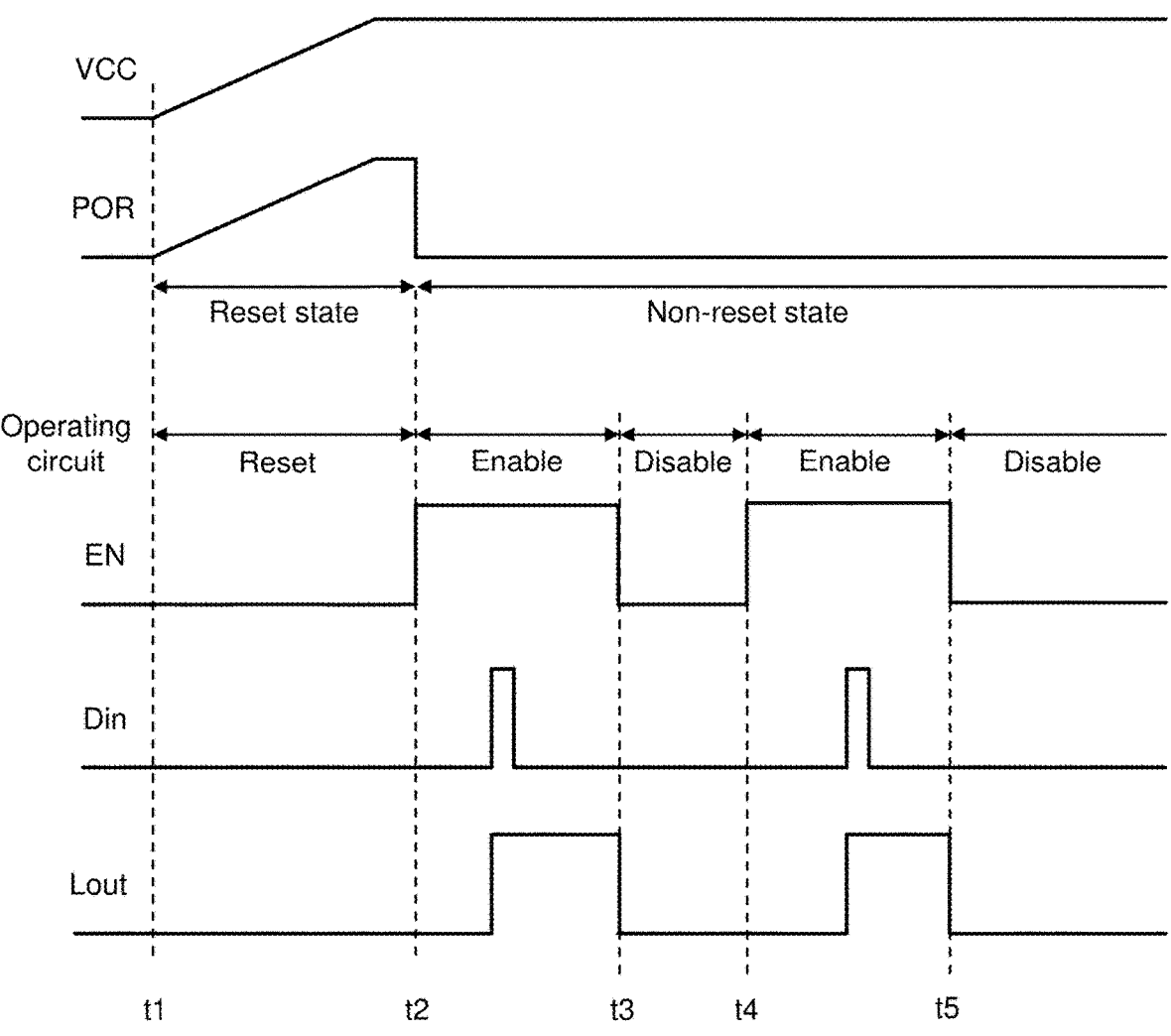
FIG. 4B shows an operation waveform diagram corresponding to FIG. 3B of an embodiment of the power-on reset system of the present invention.

Please refer to FIGS. 3B and 4B concurrently. FIG. 3B shows a block diagram of an embodiment of the power-on reset system of the present invention. FIG. 4B shows an operation waveform diagram corresponding to FIG. 3B of an embodiment of the power-on reset system of the present invention. The power-on reset system 3001' and the operating circuit 300' in FIG. 3B are similar to the power-on reset system 3001 and the operating circuit 300 in FIG. 3A, respectively. In this embodiment, the operating circuit 300' operates further according to the enablement of the enable signal EN. As specifically illustrated in FIG. 4B, after time t2, the power-on reset signal POR turns to a low level, causing the operating circuit 300' to enter a non-reset state. In the non-reset state, the operating circuit 300' operates during the enablement period of the enable signal EN (e.g., the high level from t2 to t3 or t4 to t5) and is disabled during the disablement period of the enable signal EN (e.g., the low level between t3 and t4 or after t5).

It should be noted that, as shown in FIGS. 4A and 4B, after the first enablement of the enable signal EN (after time t2), the power-on reset signal POR remains in the non-reset state until the supply voltage VCC is turned off. Upon the next start-up of the supply voltage VCC following a power-down, the power-on reset signal POR re-enters the reset state according to the supply voltage VCC, thereby resetting the operating circuits 300 and 300' again.

Figure 5A:
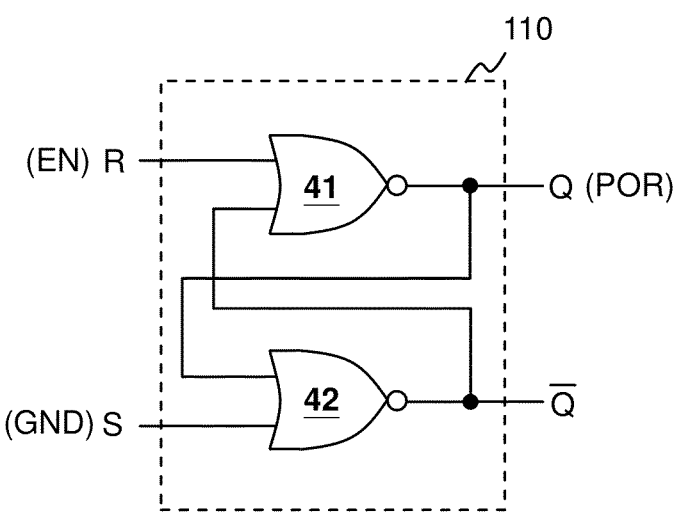
FIGS. 5A and 5B show schematic diagrams of two specific embodiments of the SR latch circuit in the power-on reset system of the present invention.
Figure 5B:
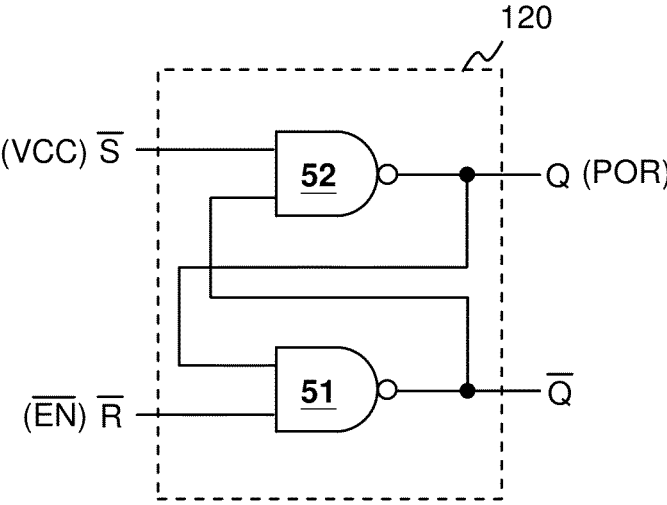

FIGS. 5A and 5B show schematic diagrams of two specific embodiments of the SR latch circuit in the power-on reset system of the present invention. In one embodiment, each of the SR latch circuits 100 in FIGS. 3A and 3B includes plural logic gates, which include a first logic gate and a second logic gate. In one embodiment, the first logic gate and the second logic gate are both NOR gates or both NAND gates. Specifically, each of the SR latch circuits 100 in FIGS. 3A and 3B can be configured as an SR latch circuit 110 in FIG. 5A or an SR latch circuit 120 in FIG. 5B. In one embodiment, the first logic gate and the second logic gate can be respectively configured as a NOR gate 41 and a NOR gate 42 in the SR latch circuit 110 in FIG. 5A. In another embodiment, the first logic gate and the second logic gate can be respectively configured as a NAND gate 51 and a NAND gate 52 in the SR latch circuit 120 in FIG. 5B.

In one embodiment, as shown in FIG. 5A, the first logic gate and the second logic gate are cross-coupled to each other. Specifically, an input terminal of the NOR gate 41 corresponds to a reset terminal R of the SR latch circuit 110, and the other input terminal thereof is coupled to an output terminal of the NOR gate 42 (corresponding to a negative output terminal $\overline{Q}\,\overline{Q}\,\overline{Q}$ of the SR latch circuit 110). An input terminal of the NOR gate 42 corresponds to a set terminal S of the SR latch circuit 110, and the other input terminal thereof is coupled to an output terminal of the NOR gate 41 (corresponding to a positive output terminal Q of the SR latch circuit 110). In one embodiment, the first logic gate receives a signal related to the enable signal EN, and the second logic gate receives a signal related to the supply voltage VCC. The output of one of the first logic gate or the second logic gate corresponds to the power-on reset signal POR. In this embodiment, the NOR gate 41 receives the enable signal EN (via the reset terminal R), and the NOR gate 42 receives the signal related to the supply voltage VCC. In this embodiment, the set terminal S corresponding to the NOR gate 42 receives a ground potential, and the output terminal of the NOR gate 41 (i.e., the positive output terminal Q of the SR latch circuit 110) corresponds to the power-on reset signal POR.

In one embodiment, as shown in FIG. 5B, the coupling structure of the NAND gate 51 and the NAND gate 52 is similar to that of FIG. 5A, which can be deduced by those skilled in the art from FIG. 5A and thus will not be redundantly described. The difference is that, in the embodiment of FIG. 5B, the NAND gate 51 receives an inverted enable signal EN (via an inverted reset terminal $\overline{R}$ of the SR latch circuit 120). In this embodiment, an inverted set terminal $\overline{S}$ corresponding to the NAND gate 52 receives the supply voltage VCC, and an output terminal of the NAND gate 52 (i.e., a positive output terminal Q of the SR latch circuit 120) corresponds to the power-on reset signal POR. The following describes the operation of specific embodiments of FIG. 5A, and those skilled in the art can deduce the operation of specific embodiments of FIG. 5B from the following description.

Figure 6:
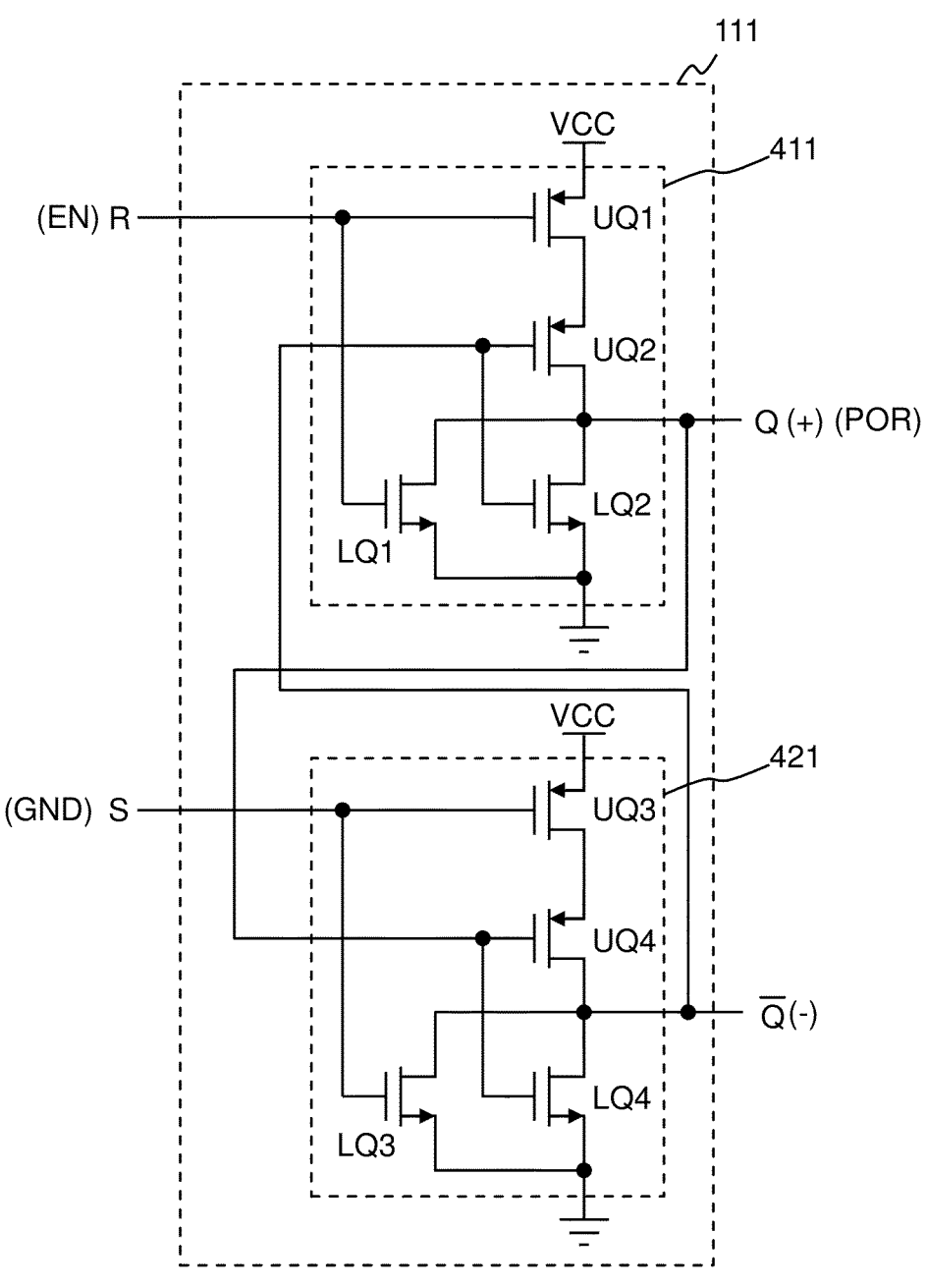
FIG. 6 shows a schematic diagram of a specific embodiment of the SR latch circuit in the power-on reset system of the present invention.

FIG. 6 shows a schematic diagram of a specific embodiment of the SR latch circuit in the power-on reset system of the present invention. An SR latch circuit 111 of FIG. 6 is a specific embodiment of the SR latch circuit 110 of FIG. 5A. In one embodiment, each of the first logic gate (i.e., NOR gate 411) and the second logic gate (i.e., NOR gate 421) in the SR latch circuit 111 includes plural upper transistors and plural lower transistors complementarily coupled to each other. Specifically, the NOR gate 411 includes upper transistors UQ1 and UQ2, and lower transistors LQ1 and LQ2. The NOR gate 421 includes upper transistors UQ3 and UQ4, and lower transistors LQ3 and LQ4.

In one embodiment, the conduction impedances of the plural upper transistors and plural lower transistors in at least one of the first logic gate and the second logic gate are asymmetrical to an extent that the SR latch circuit 111 has the aforementioned predetermined state upon the start-up of the supply voltage VCC.

Specifically, the plural upper transistors and plural lower transistors in the NOR gate 411 and the NOR gate 421 in FIG. 6 are configured as one of the following:

(1) The conduction impedances of the upper transistors UQ1 and UQ2 in the NOR gate 411 are smaller than those of the lower transistors LQ1 and LQ2, i.e., the width-to-length ratios of the upper transistors UQ1 and UQ2 are larger than those of the lower transistors LQ1 and LQ2; or (2) The conduction impedances of the upper transistors UQ3 and UQ4 in the NOR gate 421 are larger than those of the lower transistors LQ3 and LQ4, i.e., the width-to-length ratios of the upper transistors UQ3 and UQ4 are smaller than those of the lower transistors LQ3 and LQ4; or (3) The NOR gate 411 is configured as (1) above and the NOR gate 421 is configured as (2) above.

Figure 7:
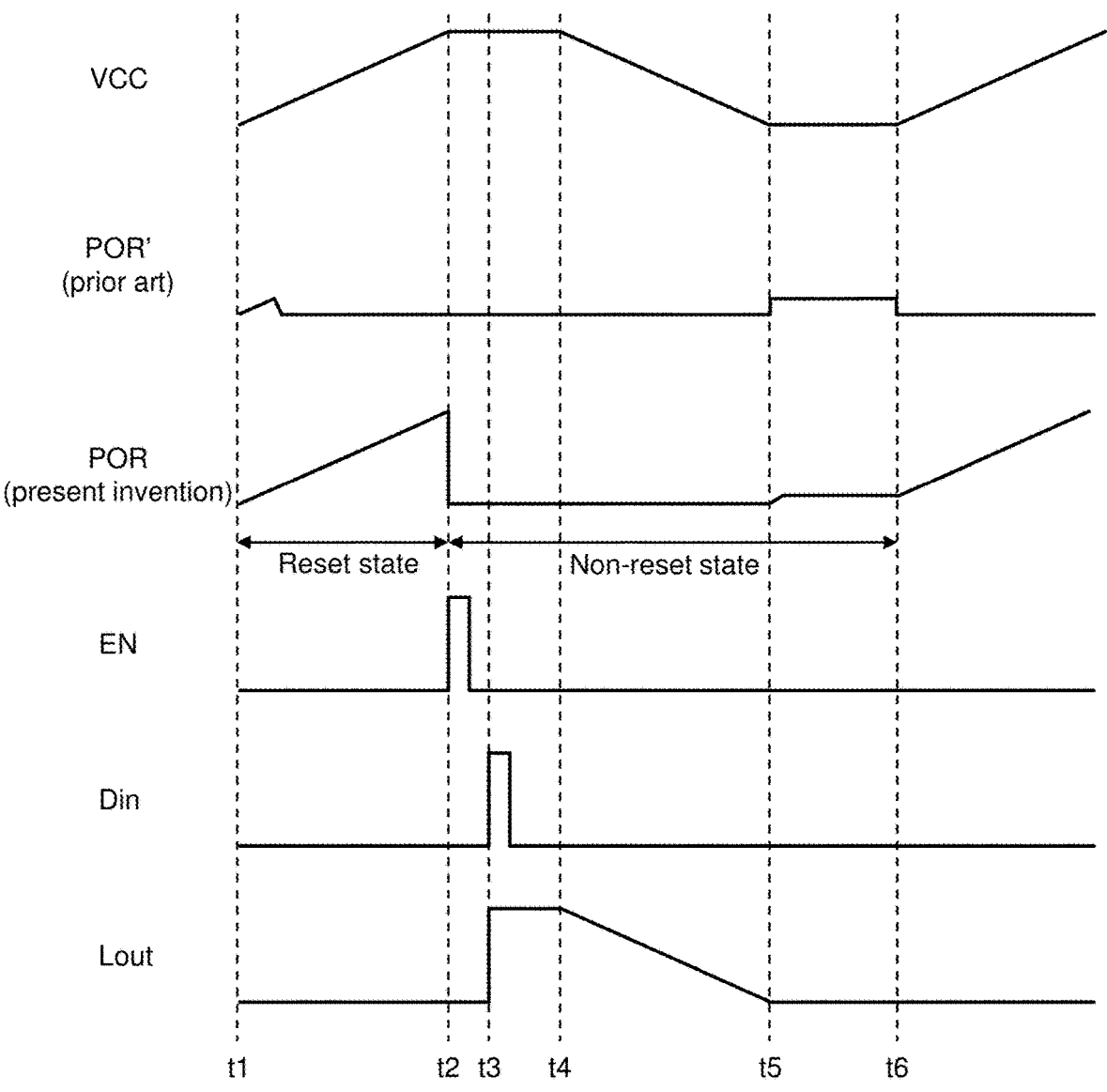
FIG. 7 shows an operation waveform diagram of an embodiment of the power-on reset system of the present invention compared to the prior art.

Please refer to FIGS. 6 and 7 concurrently. FIG. 7 shows an operation waveform diagram of an embodiment of the power-on reset system of the present invention compared to the prior art. In one embodiment, with the configuration in FIG. 6, the output terminal of the SR latch circuit 111 has a predetermined state, that is, the level of the power-on reset signal POR output from the positive output terminal Q is higher than that of the signal output from the negative output terminal $\overline{Q}\,\overline{Q}\,\overline{Q}$. Thus, after the supply voltage VCC starts up at time t1 and before the first enablement of the enable signal EN at time t2, even if the level of the supply voltage VCC ramps up slowly during start-up (as shown in FIG. 7, the time from t1 to t2 is relatively long), the level of the power-on reset signal POR can still continuously ramp up with the ramping-up of the supply voltage VCC, thereby entering the reset state. This avoids the situation in the prior art where the level of the power-on reset signal POR cannot rise to the proper reset state during the start-up of the supply voltage VCC (as shown by the second waveform POR' in FIG. 7).

Please refer to FIGS. 3A, 6, and 7 concurrently. As shown in FIG. 7, in one embodiment, the level of the power-on reset signal POR ramps up according to the level of the supply voltage VCC, thereby entering the reset state. At the first enablement of the enable signal EN (at time t2), the power-on reset signal POR turns to a low level, entering the non-reset state. It keeps at the non-reset state until the supply voltage VCC is turned off (e.g., at time t5). When the supply voltage VCC starts up again (e.g., at time t6), the level of the power-on reset signal POR ramps up again according to the level of the supply voltage VCC. In one embodiment, during the non-reset state (from time t2 to t5), the set terminal S of the state circuit 200 begins to operate normally based on the input signal Din (e.g., at time t3). For example, the output signal Lout generated by the positive output terminal Q of the state circuit 200 is triggered to a high level by the input signal Din. In one embodiment, the output signal Lout turns to a high level at time t3 and maintains this level for a period of time, and then gradually ramps down to a low level at time t4 as the level of the supply voltage VCC ramps down.

Figure 8A:
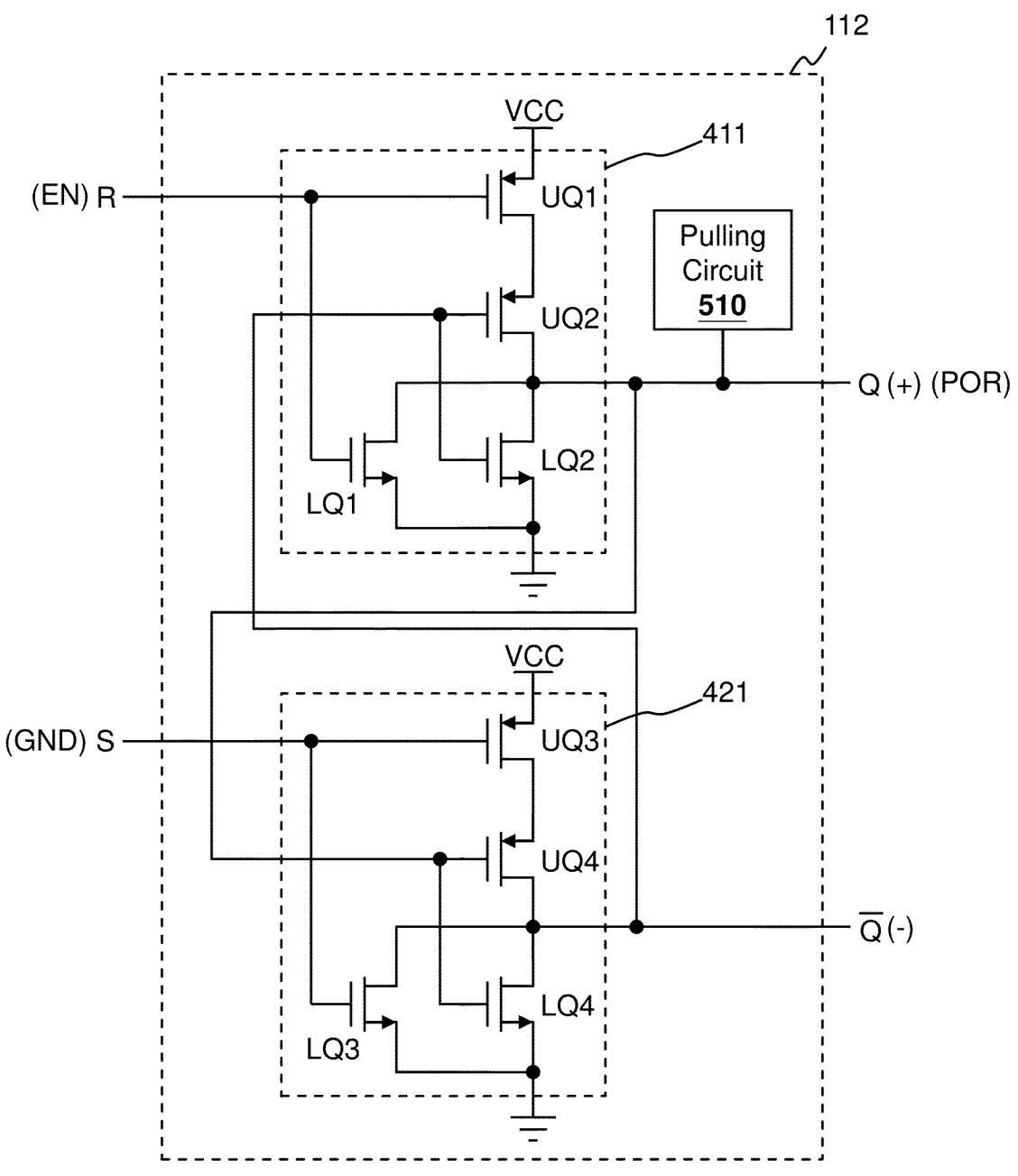
FIGS. 8A and 8B show schematic diagrams of two specific embodiments of the SR latch circuit in the power-on reset system of the present invention.
Figure 8B:
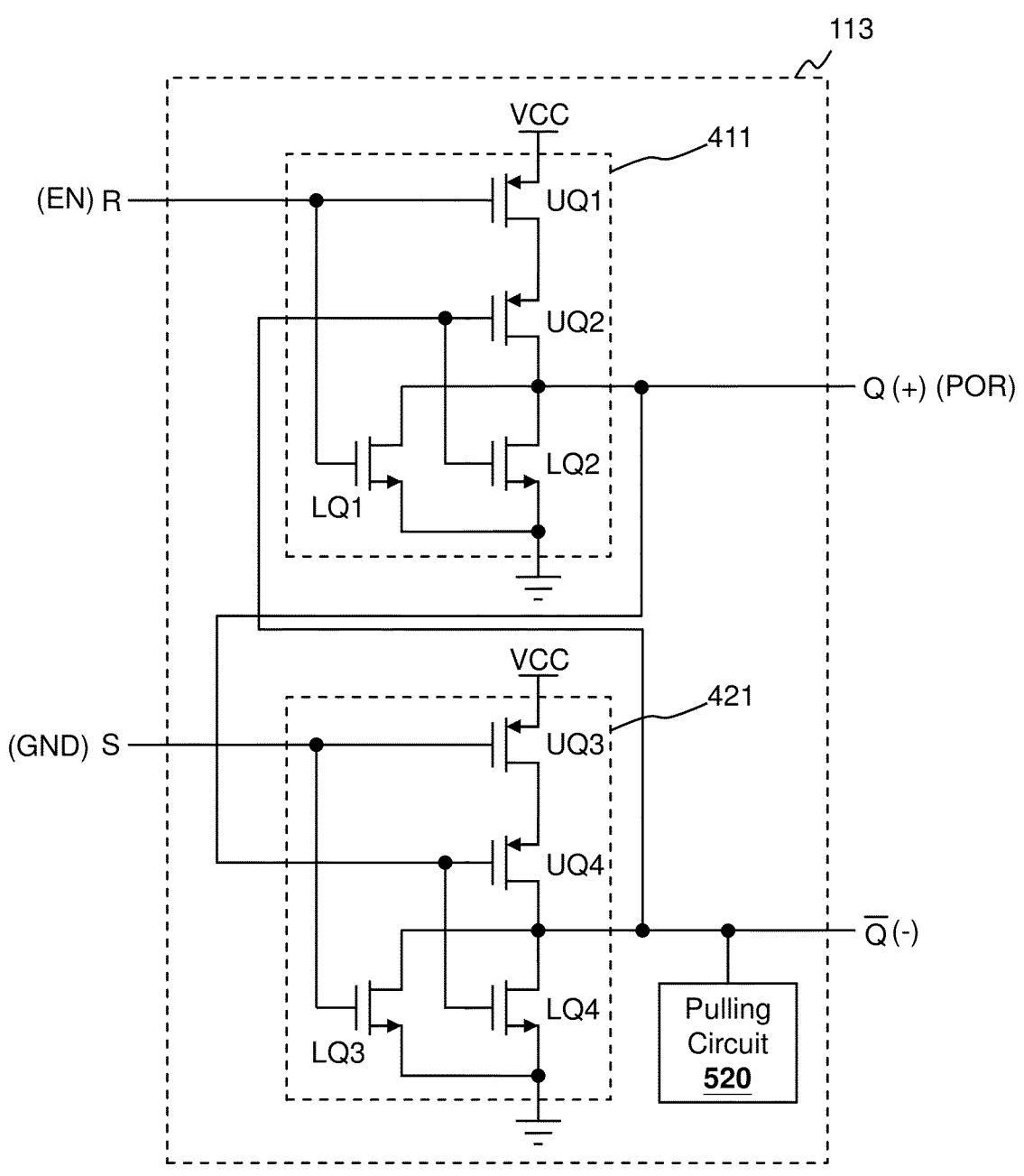

FIGS. 8A and 8B show schematic diagrams of two specific embodiments of the SR latch circuit in the power-on reset system of the present invention. An SR latch circuit 112 of FIG. 8A and an SR latch circuit 113 of FIG. 8B are similar to the SR latch circuit 111 of FIG. 6. The difference is that each of the SR latch circuit 112 and the SR latch circuit 113 further includes a pulling circuit. In one embodiment, as shown in FIG. 8A, the pulling circuit 510 is coupled to the positive output terminal Q. In another embodiment, as shown in FIG. 8B, the pulling circuit 520 is coupled to the negative output terminal $\overline{Q}\,\overline{Q}\,\overline{Q}$. In yet another embodiment, the SR latch circuit of the present invention includes a pulling circuit coupled to the positive output terminal Q and a pulling circuit coupled to the negative output terminal $\overline{Q}\,\overline{Q}$ $\overline{Q}$. In one embodiment, the pulling circuit 510 is configured to pull the positive output terminal Q to a first predetermined voltage when the supply voltage VCC starts up. In another embodiment, the pulling circuit 520 is configured to pull the negative output terminal $\overline{Q}\,\overline{Q}\,\overline{Q}$ to a second predetermined voltage when the supply voltage VCC starts up.

In one embodiment, the first predetermined voltage has a high level, and the second predetermined voltage has a low level. The first predetermined voltage and the second predetermined voltage are complementary. In a specific embodiment, the first predetermined voltage is the supply voltage VCC, and the second predetermined voltage is ground potential. By pulling the positive output terminal Q to the supply voltage VCC and/or pulling the negative output terminal $\overline{Q}\,\overline{Q}\,\overline{Q}$ to the ground potential, the pulling circuit ensures that the output terminal of the SR latch circuit has the predetermined state when the supply voltage VCC starts up. For details on the predetermined state, refer to the descriptions of FIGS. 6 and 7, which are not redundantly described here.

FIGS. 9A to 9C show schematic diagrams of various specific embodiments of the pulling circuit corresponding to FIG. 8A of the present invention. FIGS. 10A to 10C show schematic diagrams of various specific embodiments of the pulling circuit corresponding to FIG. 8B of the present invention. In one embodiment, as shown in FIGS. 9A to 9C, the pulling circuit 510 includes a pull-up component, which can be configured as a pull-up component 511, a pull-up component 512, or a pull-up component 513. In another embodiment, as shown in FIGS. 10A to 10C, the pulling circuit 520 also includes a pull-up component, which can be configured as a pull-up component 521, a pull-up component 522, or a pull-up component 523.

In one embodiment, the pulling component 511 and the pulling component 521 respectively include an enhancement-mode MOS transistor QE1 and QE2, with their gates and sources coupled to each other and controlled to be non-conductive. Specifically, the pulling components 511 and 521 pull the corresponding output terminals to the predetermined voltage through the leakage current of the enhancement-mode MOS transistors QE1 and QE2. In one embodiment, the pulling component 512 and the pulling component 522 respectively include a depletion-mode MOS transistor QD1 and QD2, with their gates and sources coupled to each other and controlled to be non-conductive. In one embodiment, the pulling component 513 and the pulling component 523 respectively include a resistor R1 and a resistor R2.

It should be noted that FIGS. 6, 8A, and 8B correspond to FIG. 5A, showing specific embodiments of the SR latch circuit including NOR gates. Corresponding to FIG. 5B, the specific transistor-level implementations of the SR latch circuit including NAND gates can be deduced by those skilled in the art and are not redundantly described here.

The present invention has been described in considerable detail with reference to certain preferred embodiments thereof. It should be understood that the description is for illustrative purpose, not for limiting the broadest scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A power-on reset system comprising:
an SR latch circuit, powered by a supply voltage and configured to generate a power-on reset signal according to the supply voltage and an enable signal, wherein an enablement or a disablement of the enable signal is unrelated to a rising edge or a falling edge of the supply voltage, wherein the enablement of the enable signal includes a first enablement of the enable signal; and
at least one operating circuit, powered by the supply voltage and configured to reset at least one state circuit within each of the at least one operating circuit according to the power-on reset signal;
wherein when the supply voltage starts up, an output terminal of the SR latch circuit is configured to have and keep at a predetermined state, such that after a start-up of the supply voltage and before the first enablement of the enable signal, the power-on reset signal is in a reset state to reset the at least one state circuit within each of the at least one operating circuit;
wherein after the first enablement of the enable signal subsequent to the start-up of the supply voltage, the power-on reset signal turns to a non-reset state.

2. The power-on reset system of claim 1, wherein the SR latch circuit includes plural logic gates which include:
a first logic gate and a second logic gate cross-coupled through feedback connections to each other, wherein the first logic gate receives a signal related to the enable signal, and the second logic gate receives a signal related to the supply voltage, wherein one of outputs of either the first logic gate or the second logic gate corresponds to the power-on reset signal.

3. The power-on reset system of claim 2, wherein each of the plural logic gates includes plural upper transistors and plural lower transistors complementarily coupled to each other, wherein conduction impedances of the plural upper transistors and the plural lower transistors in at least one of the first logic gate and the second logic gate are asymmetrical to an extent that the output terminal of the SR latch circuit has the predetermined state upon the start-up of the supply voltage.

4. The power-on reset system of claim 2, wherein the output terminal includes a positive output terminal and a negative output terminal, the power-on reset system further comprising:

a pulling circuit configured to pull at least one of the positive output terminal and the negative output terminal to a corresponding predetermined voltage upon the start-up of the supply voltage, such that the output terminal of the SR latch circuit has the predetermined state.

5. The power-on reset system of claim 4, wherein the pulling circuit is configured to pull the positive output terminal to a first predetermined voltage, and/or to pull the negative output terminal to a second predetermined voltage, wherein the first predetermined voltage and the second predetermined voltage are complementary.

6. The power-on reset system of claim 5, wherein the pulling circuit includes a pulling component coupled to either the positive output terminal or the negative output terminal for pulling the respective terminal to the corresponding predetermined voltage, wherein the pulling component includes:

an enhancement-mode MOS transistor controlled to be non-conductive;

a depletion-mode MOS transistor controlled to be non-conductive; or a resistor.

7. The power-on reset system of claim 2, wherein each of the first logic gate and the second logic gate is either a NOR gate or a NAND gate.

8. The power-on reset system of claim 1, wherein the power-on reset signal remains in the non-reset state until the supply voltage is turned off, wherein during the non-reset state of the power-on reset signal, the operating circuit is further configured to operate when the enable signal is enabled and to cease operating when the enable signal is disabled.

\* \* \* \* \*